United States Patent [19]

Akazawa

[11] 4,303,894

[45] Dec. 1, 1981

[54] FM MODULATOR USING VARIABLE TRANSISTOR CAPACITANCE

[75] Inventor: Itsuo Akazawa, Soma, Japan

[73] Assignee: Alps Electric Co., Ltd., Tokyo, Japan

[21] Appl. No.: 118,518

[22] Filed: Feb. 4, 1980

[30] Foreign Application Priority Data

Feb. 8, 1979 [JP] Japan .............................. 54-15220[U]

[51] Int. Cl.³ .............................................. H03C 3/14
[52] U.S. Cl. .............................. 332/16 T; 331/117 R; 331/177 V; 332/30 V
[58] Field of Search ................. 332/16 T, 30 R, 30 V; 331/117 R, 177 V, 36 C

[56] References Cited

U.S. PATENT DOCUMENTS

| | | | |
|---|---|---|---|
| 2,888,648 | 5/1959 | Herring | 332/16 T |
| 3,108,234 | 10/1963 | Burns | 332/16 T X |
| 3,728,645 | 4/1973 | Rosen et al. | 332/30 V X |
| 4,021,737 | 5/1977 | Trask | 332/16 T X |

*Primary Examiner*—Siegfried H. Grimm
*Attorney, Agent, or Firm*—Guy W. Shoup; Gerard F. Dunne

[57] ABSTRACT

In an FM modulation circuit, a variable capacitance circuit employs a transistor as a variable capacitance element. The transistor has resistors connected between the emitter and base thereof and between the collector and base thereof, respectively, and is connected under the unbiased state to an oscillating transistor of an oscillation circuit constituting the FM modulation circuit. In correspondence with an input signal applied across the emitter and collector of the variable capacitance transistor, the emitter—collector capacitance of this transistor is varied to vary the oscillation frequency of the oscillation circuit.

2 Claims, 3 Drawing Figures

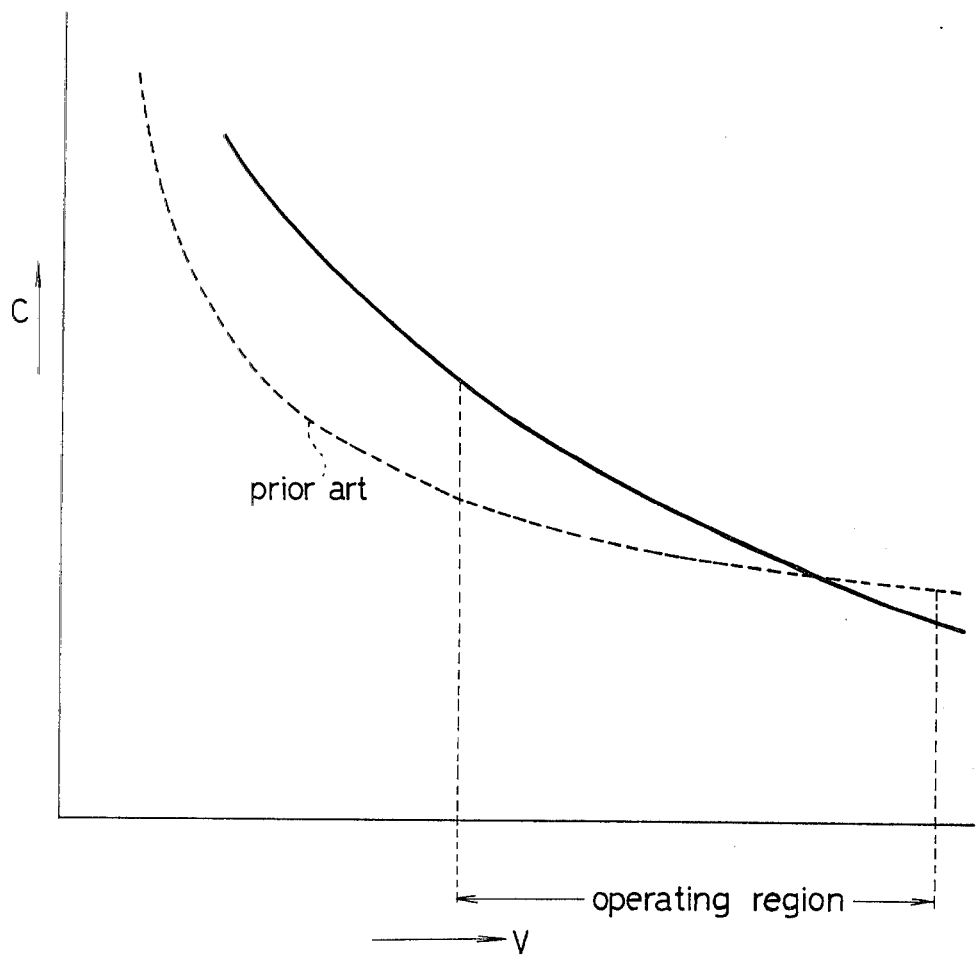

FM MODULATOR USING VARIABLE TRANSISTOR CAPACITANCE

BACKGROUND OF THE INVENTION

1. Field of the Invention

The present invention relates to an FM modulation circuit for use in a video modulator or the like, and more particularly to an improved FM modulation circuit of high modulation degree and reduced modulation distortion.

2. Description of the Prior Art

A known form of FM modulation circuit is shown in FIG. 1 and comprises an oscillation circuit and a variable capacitance circuit. In the oscillation circuit, a resonance circuit consisting of a capacitor 11 and a coil 13 is connected to the collector of a transistor 12 for oscillation, a feedback capacitor 14 is connected between the collector and emitter of the transistor 12, and bias resistors 8, 9 and 17 are disposed as shown. Shown at numerals 10 and 15 are capacitors. The variable capacitance circuit is connected to the resonance circuit of the oscillation circuit, and a voice signal applied to the variable capacitance circuit varies the capacitance thereof, whereby the oscillation frequency of the oscillation circuit is varied in correspondence with the voice signal.

The variable capacitance circuit enclosed with broken lines in FIG. 1 has a varactor diode 6 which is given an appropriate bias by means of resistors 4 and 5. The voice signal is applied from an input terminal 1 to the varactor diode 6 through a capacitor 2 and a resistor 3 so as to vary the capacitance of the varactor diode 6 in correspondence with the voice signal. The variable capacitance circuit and the oscillation circuit are coupled through a capacitor 7 having a capacitance on the order of 130 pF. The FM output is delivered from the oscillation circuit to a terminal 18 via a capacitor 16.

The FM modulation circuit as stated above employs the varactor diode in the variable capacitance circuit, and therefore has the following disadvantages. When the bias voltage is made small in order to raise the modulation degree, the variation in the capacitance is not linear and the modulation distortion increases. On the other hand, when the bias voltage is made great in order to reduce the modulation distortion, the capacitance variation is small and the modulation degree lowers.

SUMMARY OF THE INVENTION

The present invention has for its object to eliminate the disadvantages described above by providing an FM modulation circuit in which an unbiased transistor is used as a variable capacitance element, thereby to realize a great capacitance variation and reduced modulation distortion.

In one aspect of performance of the present invention, an FM modulation circuit comprises a transistor as a variable capacitance element which has resistors connected between an emitter and a base thereof and between a collector and the base thereof, respectively, and a transistor for oscillation to which the first-mentioned transistor is connected under an unbiased state, an input signal being applied across the emitter and the collector of said first-mentioned transistor and being modulated.

BRIEF DESCRIPTION OF THE DRAWINGS

FIG. 3 is a graph showing the relationships between the varying capacitance and the voltage in the circuits of the FIG. 1 and the present invention.

PREFERRED EMBODIMENT OF THE INVENTION

Figure 2:
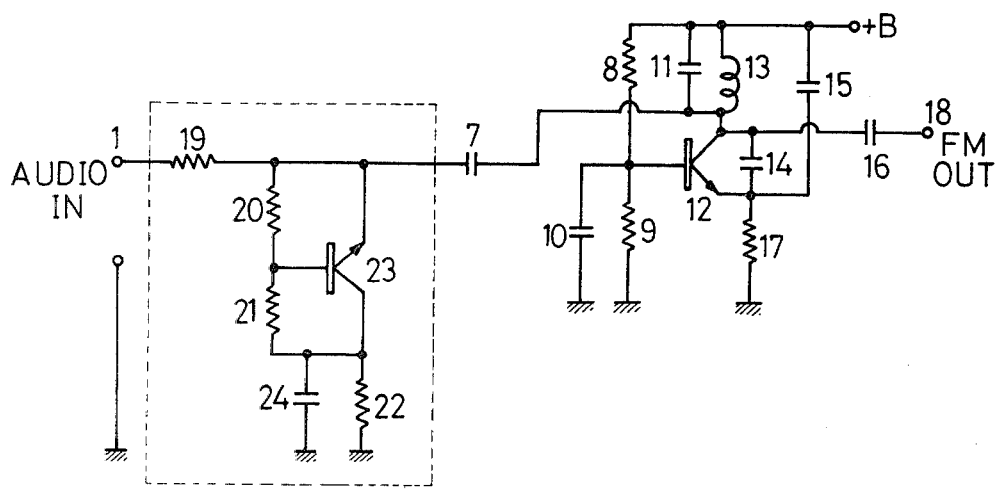
FIG. 2 is a circuit diagram showing an embodiment of the present invention.

FIG. 2 shows an FM modulation circuit embodying the present invention. An oscillation circuit is constructed in such a manner that a resonance circuit consisting of a capacitor 11 and a coil 13 is connected to the collector of a transistor 12 for oscillation; and a feedback capacitor 14 is connected between the collector and emitter of the transistor 12. Bias resistors 8, 9 and 17 are disposed as shown. Numerals 10 and 15 designate capacitors. A variable capacitance circuit is connected to the resonance circuit of the oscillation circuit through a capacitor 7. A voice signal is applied from a terminal 1 to the variable capacitance circuit to vary the capacitance thereof, and can FM signal in which the oscillation frequency of the oscillation circuit is varied in correspondence with the input voice signal is derived from a terminal 18 through a capacitor 16. Thus, the FM modulation circuit is constructed.

The variable capacitance circuit is enclosed with broken lines in FIG. 2. The emitter of a transistor 23 is connected to the terminal 1 through a resistor 19 having a resistance on the order of 100 kΩ, and a resistor 20 having a resistance on the order of 100 kΩ is connected between the emitter and base of the transistor 23. A resistor 21 having a resistance on the order of 100Ω is connected between the collector and base of the transistor 23, and a capacitor 24 having a capacitance on the order of 1,000 pF and a resistor 22 having a resistance on the order of 100 kΩ are disposed in parallel between the collector of the transistor 23 and the ground. The transistor 23 is used in the unbiased state. The capacitor 7 through which the variable capacitance circuit is connected to the oscillation circuit has a capacitance on the order of 30 pF.

When the voice signal is applied from the terminal 1, the emitter—base path of the transistor 23 is reverse-biased and the collector—base path is forward-biased in some cases, and conversely the emitter—base path is forward-biased and the collector—base path is reverse-biased in other cases.

In the former situation where the positive part of the voice signal is applied, in spite of the fact that the emitter—base path is reverse-biased while the collector—base path is forward-biased, the emitter—base capacitance becomes greater than the collector—base capacitance because the junction capacitance between the emitter and the base is greater than the junction capacitance between the collector and the base, and the resistance value of the resistor 21 is sufficiently smaller than the resistance value of the resistor 20. Thus, the emitter—collector capacitance is governed by only the collector—base capacitance. On the other hand, in the latter situation where the negative part of the voice signal is applied, the emitter—base path is forward-biased while the collector—base path is reverse-biased, and hence, the emitter—base capacitance is greater than the collector—base capacitance. Thus, the emitter—collector capacitance is governed by the collector—base capacitance.

Figure 1:
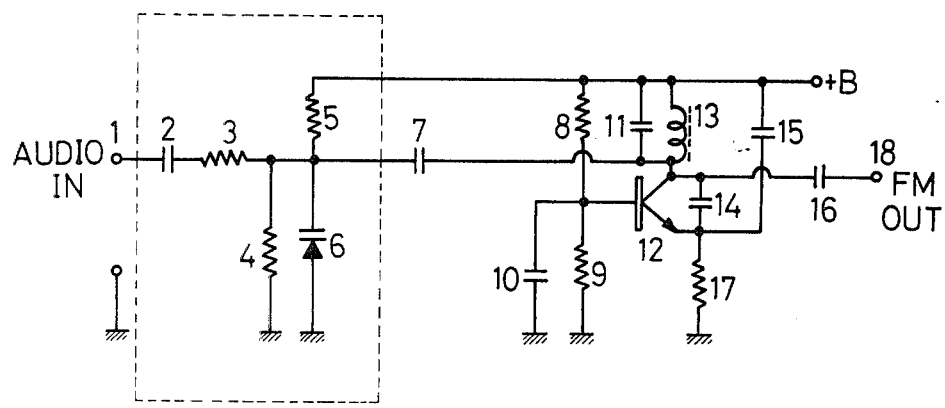
FIG. 1 is a circuit diagram showing a known form of FM modulation circuit.

FIG. 3 shows the relationships between the capacitance variation and voltage of the variable capacitance circuits according to the present invention and that of FIG. 1. In the figure, a solid line corresponds to the present invention and a broken line to that of FIG. 1, and especially working ranges in the FM modulation circuits are made coincident. It is understood that as compared with the prior art, the embodiment can bring forth a sufficiently greater capacitance variation.

As set forth above, according to the present invention, the transistor is employed as the variable capacitance element under the unbiased state, so that the variable capacitance circuit of great capacitance variation and excellent linearity is obtained and that the FM modulation circuit of high modulation degree and reduced modulation distortion is accordingly obtained. The variable capacitance circuit of great capacitance variation and good linearity makes it possible to diminish the capacitance of the capacitor 7 connecting the oscillation circuit and the variable capacitance circuit, from 130 pF to 30 pF and to relieve the load on the oscillation circuit, so that the fluctuations of the oscillation frequency ascribable to a temperature change, a bias voltage operation, etc. can be reduced. Further, a desired curve of the capacitance variation versus the voltage is realized by adjusting the resistance value of the resistor 21 of the variable capacitance circuit.

Since the variable capacitance circuit is operated under the unbiased state, it does not need any highly stabilized power supply. Since the variable capacitance diode is substituted by the cheap transistor (for example, 2SC454 or 2SC735), the FM modulation circuit of the present invention is advantageous in point of cost.

I claim:

1. An FM modulation circuit comprising a variable capacitance circuit including a first transistor having respective resistors connected between the emitter and base thereof and between the collector and base thereof; and an oscillation circuit including a second transistor coupled to said first transistor, said first transistor being connected in an unbiased state whereby an input signal applied across the emitter and collector of said first transistor will vary the capacitance thereof.

2. In an FM modulation circuit having an oscillation circuit including a oscillation transistor, a variable capacitance circuit, and means for coupling said oscillation circuit and said variable capacitance circuit; the improvement wherein said variable capacitance circuit includes an other transistor having respective resistors connected between an emitter and a base thereof and between collector and the base thereof, respectively, said other transistor being connected to said oscillation transistor under an unbiased state, whereby an input signal applied across the emitter and the collector of said other transistor circuit will vary the emitter—collector capacitance thereof and accordingly the oscillation frequency of said oscillation circuit in correspondence with said input signal.

* * * * *